(12) United States Patent  (10) Patent No.: US 8,912,100 B1
Wang et al.  (45) Date of Patent: Dec. 16, 2014

(54) MANUFACTURING METHOD OF COMPLEMENTARY METAL OXIDE SEMICONDUCTOR

(71) Applicant: Mosel Vitelic Inc., Hsinchu (TW)

(72) Inventors: Chyan-Huei Wang, Hsinchu (TW); Shiu-Fang Lo, Hsinchu (TW); Jack Jan, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 14/020,470

(22) Filed: Sep. 6, 2013

(30) Foreign Application Priority Data

Aug. 14, 2013 (TW) .............................. 102129209 A

(51) Int. Cl.
*H01L 21/31* (2006.01)
*H01L 21/469* (2006.01)
*H01L 23/58* (2006.01)
*H01L 49/02* (2006.01)

(52) U.S. Cl.
CPC ..................................... *H01L 28/40* (2013.01)
USPC ........................................................ 438/769

(58) Field of Classification Search
CPC ............ H01L 21/02557; H01L 21/025; H01L 21/306; H01L 21/743; H01L 27/1203
See application file for complete search history.

(56) References Cited

U.S. PATENT DOCUMENTS

| 5,060,195 A * | 10/1991 | Gill et al. ................. 365/185.06 |
| 6,486,692 B1 * | 11/2002 | Chen ......................... 324/750.03 |
| 2006/0286812 A1 * | 12/2006 | Tao et al. ...................... 438/769 |

* cited by examiner

*Primary Examiner* — Zandra Smith
*Assistant Examiner* — Pamela E Perkins
(74) *Attorney, Agent, or Firm* — Kirton McConkie; Evan R. Witt

(57) ABSTRACT

A manufacturing method of a complementary metal oxide semiconductor includes steps as following: providing a semiconductor substrate; forming a metal oxide semiconductor region having an oxide layer, which has a thickness greater than 1 micrometer, on a first surface of the semiconductor substrate; forming the oxide layer as an isolation region of the metal oxide semiconductor region and a heat-isolation region of a poly heater; forming a poly gate of the metal oxide semiconductor region as at least a portion of the poly heater; forming an interlayer dielectric layer; and processing a selenium etching. Under this circumstance, the oxide layer is applied so as to be the isolation region of the metal oxide semiconductor region and a heat-isolation region of the poly heater, the poly gate of the metal oxide semiconductor region is sufficiently utilized as the poly heater, and the heat-dissipation of the poly heater is optimized.

16 Claims, 6 Drawing Sheets the present invention relates to a complementary metal oxide semiconductor, and more particularly to a manufacturing method of a complementary metal oxide semiconductor.

MANUFACTURING METHOD OF COMPLEMENTARY METAL OXIDE SEMICONDUCTOR

FIELD OF THE INVENTION

The present invention relates to a complementary metal oxide semiconductor, and more particularly to a manufacturing method of a complementary metal oxide semiconductor.

BACKGROUND OF THE INVENTION

In the semiconductor industry, there is no doubt that the most popular product is Complementary Metal Oxide Semiconductor (hereinafter "CMOS"). CMOS is an integrated circuit component, which can be utilized for manufacturing the P-type metal oxide semiconductor field effect transistors (hereinafter "MOSFET") and the N-type MOSFETs on a wafer. The P-type MOSFET is also called "PMOS", and the N-type MOSFET is also called "NMOS". A PMOS and a NMOS are complementary to each other, so the component is called "CMOS".

In general, CMOS is applied to manufacture the microprocessors, the microcontrollers, static random access memories, image sensors or other digital logic circuits. Because the energy consumption only occurs during turning on/off the transistor, the energy waste is low, and the heat generation is also low. As a result, CMOS becomes the most common component of semiconductor processes.

However, there are still some drawbacks of the conventional method of manufacturing a CMOS. For example, the thickness of the oxide layer is not enough to be utilized as a metal oxide semiconductor isolation region or a poly heater isolation region, the poly gate of the metal oxide semiconductor region cannot be utilized as a poly heater, and the heat efficiency of an interlayer dielectric layer cannot be improved with ON, ONO, ONON, ONONO or ONONON. In addition, the ONON rest thickness of the poly heater cannot be adjusted for optimizing the heat-dissipating efficiency.

There is a need of providing a manufacturing method of a complementary metal oxide semiconductor to obviate the drawbacks encountered from the prior art.

SUMMARY OF THE INVENTION

The present invention provides a manufacturing method of a complementary metal oxide semiconductor in order to eliminate the drawbacks of that the thickness of the oxide layer is not enough, the poly gate of the metal oxide semiconductor region cannot be utilized as a poly heater, the heat efficiency of an interlayer dielectric layer cannot be improved, and the rest thickness of the surface of the poly heater cannot be adjusted for optimizing the heat-dissipating efficiency.

The present invention also provides a manufacturing method of a complementary metal oxide semiconductor. By utilizing an oxide layer having a thickness greater than 1 micrometer (10 k angstrom), the oxide layer is applied so as to be the isolation region of the metal oxide semiconductor region and a heat-isolation region of the poly heater. Meanwhile, by forming the poly gate as at least a portion of the poly heater, improving the heat efficiency of the poly heater with the interlayer dielectric layer utilizing a multi-layer structure of the oxide and the nitride such as ON, ONO, ONON, ONONO or ONONON, and adjusting the rest thickness of the multi-layer structure of the nitride and the oxide (i.e. the ONON structure of the poly heater) through the selenium etching process, the poly gate of the metal oxide semiconductor region is sufficiently utilized as the poly heater, and the heat-dissipation of the poly heater is optimized.

In accordance with an aspect of the present invention, there is provided a manufacturing method of a complementary metal oxide semiconductor. The manufacturing method includes steps as following: providing a semiconductor substrate; forming a metal oxide semiconductor region having an oxide layer on a first surface of the semiconductor substrate, among which the oxide layer has a thickness greater than 1 micrometer (10 kÅ); forming the oxide layer as an isolation region of the metal oxide semiconductor region and a heat-isolation region of a poly heater; forming a poly gate of the metal oxide semiconductor region as at least a portion of the poly heater; forming an interlayer dielectric layer; and processing a selenium etching.

The above contents of the present invention will become more readily apparent to those ordinarily skilled in the art after reviewing the following detailed description and accompanying drawings, in which:

DETAILED DESCRIPTION OF THE PREFERRED EMBODIMENT

Figure 1A:
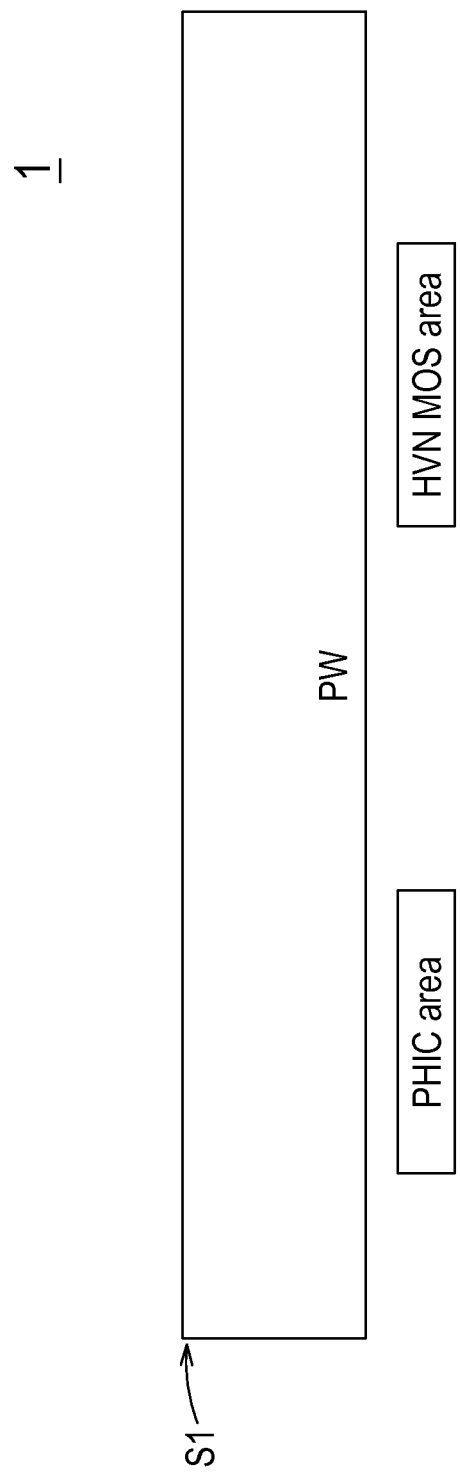
FIG. 1A to FIG. 1F schematically illustrate the structures corresponding to the steps of a manufacturing method of a complementary metal oxide semiconductor according to an embodiment of the present invention.
Figure 1B:
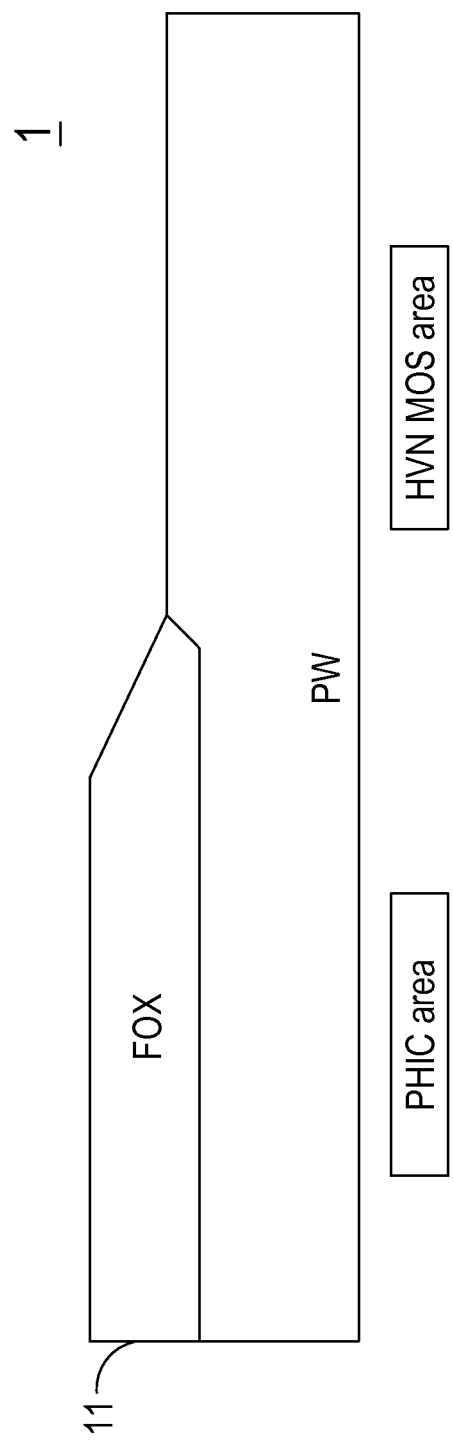
Figure 1C:
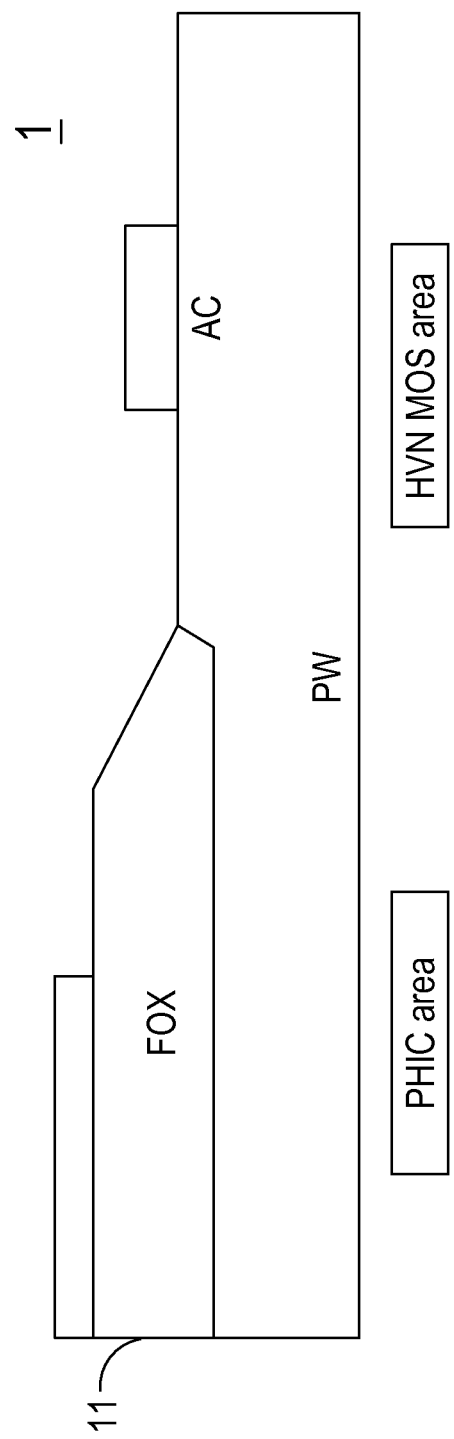
Figure 1D:
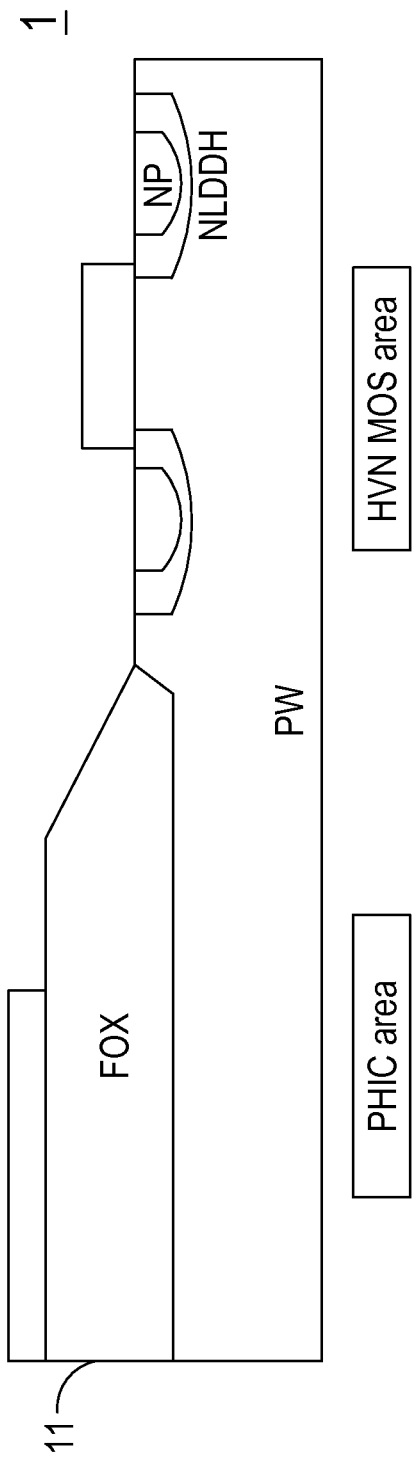
Figure 1E:
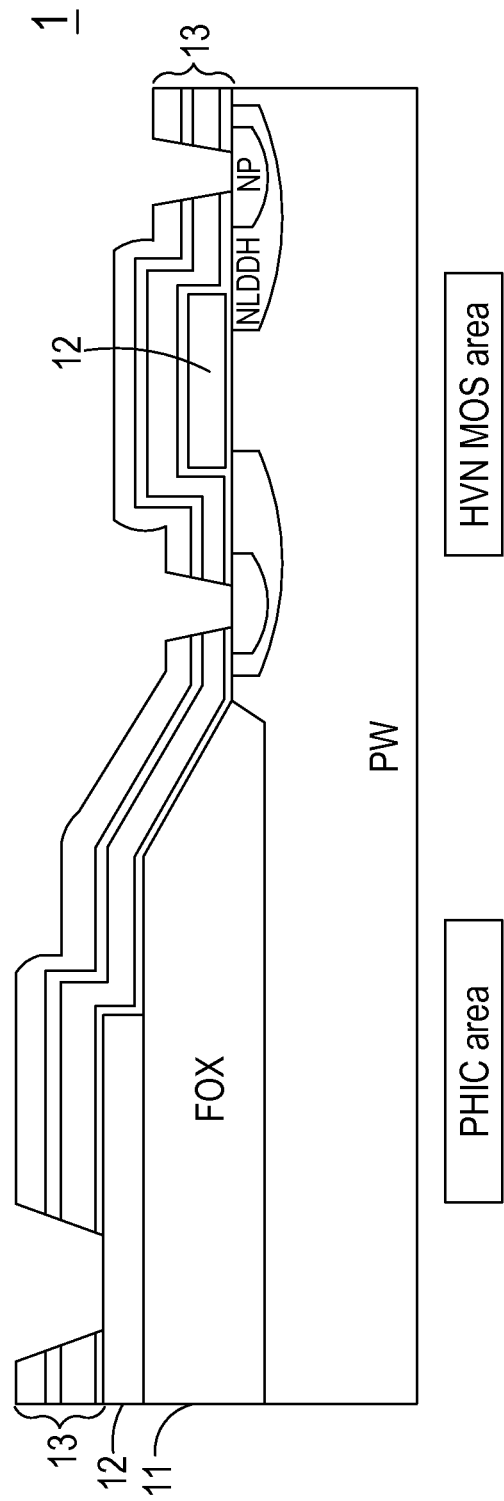

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Please refer to FIG. 1A to FIG. 1F. FIG. 1A to FIG. 1F schematically illustrate the structures corresponding to the steps of a manufacturing method of a complementary metal oxide semiconductor according to an embodiment of the present invention. As shown in FIG. 1A to FIG. 1F, the manufacturing method of a complementary metal oxide semiconductor of the present invention includes steps as follows. First, providing a semiconductor substrate 1, among which the semiconductor substrate 1 is not limited to a N-type semiconductor substrate or a P-type semiconductor substrate and is for example a wafer. Next, forming a metal oxide semiconductor region 10 having an oxide layer, which is for example a field oxide layer 11 (FOX), on a first surface S1 of the semiconductor substrate 1, among which the oxide layer has a thickness greater than 1 micrometer (10 kÅ). The surface S1 of the semiconductor substrate 1 is not limited to a front surface of a wafer. Then, forming the oxide layer as an isolation region of the metal oxide semiconductor region 10 and a heat-isolation region of a poly heater 12. Next, forming a poly gate of the metal oxide semiconductor region 10 as at least a portion of the poly heater 12. Further, forming an interlayer dielectric layer 13. Finally, processing a selenium etching, so that at least partially of a passive layer 14 is etched. By utilizing an oxide layer having a thickness greater than 1 micrometer (10 k angstrom), the oxide layer is applied so as to be the isolation region of the metal oxide semiconductor region and a heat-isolation region of the poly heater 12. Meanwhile, by forming the poly gate as at least a portion of the poly heater 12, the poly gate of the metal oxide semiconductor region is sufficiently utilized as the poly heater, and the heat-dissipation of the poly heater is optimized.

In some embodiments, the step of forming a metal oxide semiconductor region 10 having an oxide layer on a first surface S1 of the semiconductor substrate 1 substantially includes the n-well and p-well forming process, the shallow trench isolation process, the light doping and drain-implant process, the sidewall gap forming process, the source/drain ion-implant process, the contact window forming process, the in-area connection process, metal forming process and via connection process, which are all illustrated and shown in FIG. 1A to FIG. 1F. The above-mentioned processes are clearly shown in FIG. 1A to FIG. 1F and the final structure of the metal oxide semiconductor region 10 is not affected by the different details of each process, so the processes are not redundantly described herein. It should be noted that a metal oxide semiconductor region having an oxide layer, which has a thickness greater than 1 micrometer, is considered to be manufactured through the manufacturing method of the present invention, as which the present invention teaches.

Figure 1F:
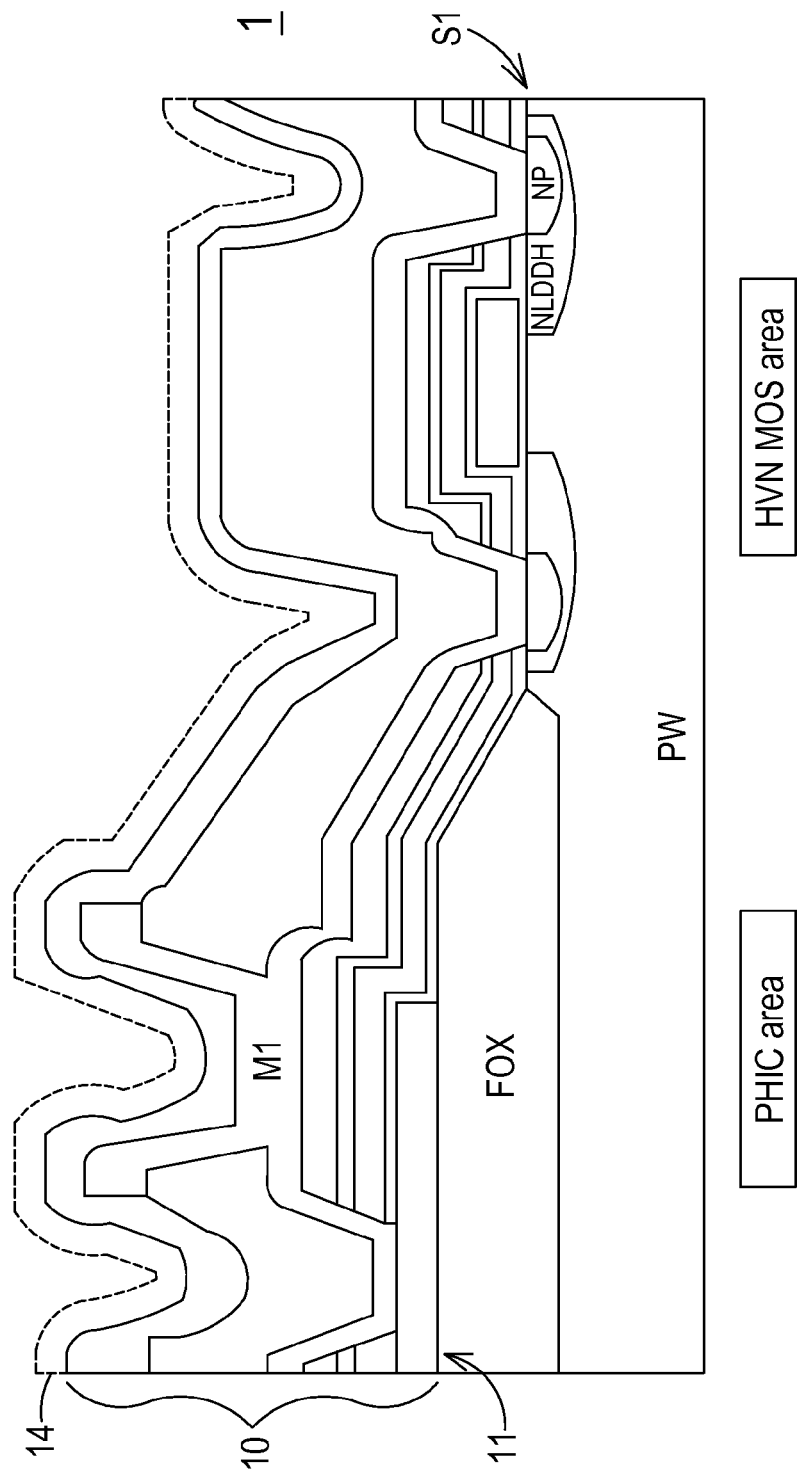

In some embodiments, the step of forming an interlayer dielectric layer 13 further includes a detailed step of forming the interlayer dielectric layer 13 with a multi-layer structure having at least an oxide and at least a nitride (as shown in FIG. 1F) for improving the heat efficiency of the poly heater 12. An example of the multi-layer structure includes but not limited to ON, ONO, ONON, ONONO or ONONON structures, which are stand for oxide-nitride, oxide-nitride-oxide, oxide-nitride-oxide-nitride, oxide-nitride-oxide-nitride-oxide and oxide-nitride-oxide-nitride-oxide-nitride structures, respectively. Certainly, the interlayer dielectric layer 13 herein is an inter-metal dielectric layer, a pre-metal dielectric layer or a nitride dielectric layer, but not limited thereto.

In some embodiments, an adjustment of the rest thickness of the multi-layer structure (e.g. the ONON structure) of the poly heater 12 is implemented by the step of processing a selenium etching, so that the heat-dissipation of the poly heater 12 is optimized. Furthermore, the step of processing a selenium etching further includes steps of opening the poly heater through selenium etching process and opening a metal region and/or a poly region for fusing the metal region and the poly region through selenium etching process.

Moreover, the manufacturing method of the complementary metal oxide semiconductor mentioned above can be not only used in general manufacture of CMOS, but also applied to the inkjet cartridge. The Capability of Precision (CP) is over 98 percent. Compared with the processes of the conventional manufacturing method of CMOS, the present invention provides high competitiveness and advantages over prior art, in which each type of wafer of CMOS is easier to be manufactured.

From the above description, the present invention provides a manufacturing method of a complementary metal oxide semiconductor. By utilizing an oxide layer having a thickness greater than 1 micrometer (10 k angstrom), the oxide layer is applied so as to be the isolation region of the metal oxide semiconductor region and a heat-isolation region of the poly heater. Meanwhile, by forming the poly gate as at least a portion of the poly heater, improving the heat efficiency of the poly heater with the interlayer dielectric layer utilizing a multi-layer structure of the oxide and the nitride such as ON, ONO, ONON, ONONO or ONONON, and adjusting the rest thickness of the multi-layer structure of the nitride and the oxide (i.e. the ONON structure of the poly heater) through the selenium etching process, the poly gate of the metal oxide semiconductor region is sufficiently utilized as the poly heater, and the heat-dissipation of the poly heater is optimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a complementary metal oxide semiconductor, comprising steps of:
   (a) providing a semiconductor substrate;
   (b) forming a metal oxide semiconductor region having an oxide layer on a first surface of the semiconductor substrate, wherein said oxide layer has a thickness greater than 1 micrometer;
   (c) forming said oxide layer as an isolation region of said metal oxide semiconductor region and a heat-isolation region of a poly heater;
   (d) forming a poly gate of said metal oxide semiconductor region as at least a portion of said poly heater;
   (e) forming an interlayer dielectric layer; and
   (f) processing a selenium etching, wherein said step (f) further comprises steps of:
      (f1) opening said poly heater through selenium etching process; and
      (f2) opening a metal region or a poly region for fusing said metal region and said poly region through selenium etching process.

2. The manufacturing method according to claim 1, wherein said oxide layer is a field oxide layer.

3. The manufacturing method according to claim 1, wherein said step (e) further comprises step (e1) of forming said interlayer dielectric layer with a multi-layer structure having at least an oxide and at least a nitride.

4. The manufacturing method according to claim 3, wherein said interlayer dielectric layer is an inter-metal dielectric layer, a pre-metal dielectric layer or a nitride dielectric layer.

5. The manufacturing method according to claim 3, wherein an adjustment of the rest thickness of said multi-layer structure is implemented by said step (f).

6. The manufacturing method according to claim 1, wherein said semiconductor substrate is a wafer, and said first surface of said semiconductor substrate is a front surface of said wafer.

7. The manufacturing method according to claim 1, wherein said semiconductor substrate is a P-type semiconductor substrate.

8. The manufacturing method according to claim 1, wherein said semiconductor substrate is a N-type semiconductor substrate.

9. A manufacturing method of a complementary metal oxide semiconductor, comprising steps of:
   (a) providing a semiconductor substrate;
   (b) forming a metal oxide semiconductor region having an oxide layer on a first surface of the semiconductor substrate, wherein said oxide layer has a thickness greater than 1 micrometer;
   (c) forming said oxide layer as an isolation region of said metal oxide semiconductor region and a heat-isolation region of a poly heater;

(d) forming a poly gate of said metal oxide semiconductor region as at least a portion of said poly heater;

(e) forming an interlayer dielectric layer; and (f) processing a selenium etching, wherein said step (f) further comprises steps of:

(f1) opening said poly heater through selenium etching process; and (f2) opening a metal region and a poly region for fusing said metal region and said poly region through selenium etching process.

10. The manufacturing method according to claim 9, wherein said oxide layer is a field oxide layer.

11. The manufacturing method according to claim 9, wherein said step (e) further comprises step (e1) of forming said interlayer dielectric layer with a multi-layer structure having at least an oxide and at least a nitride.

12. The manufacturing method according to claim 11, wherein said interlayer dielectric layer is an inter-metal dielectric layer, a pre-metal dielectric layer or a nitride dielectric layer.

13. The manufacturing method according to claim 11, wherein an adjustment of the rest thickness of said multi-layer structure is implemented by said step (f).

14. The manufacturing method according to claim 9, wherein said semiconductor substrate is a wafer, and said first surface of said semiconductor substrate is a front surface of said wafer.

15. The manufacturing method according to claim 9, wherein said semiconductor substrate is a P-type semiconductor substrate.

16. The manufacturing method according to claim 9, wherein said semiconductor substrate is a N-type semiconductor substrate.

* * * * *